(12) United States Patent
Harp et al.

(10) Patent No.: US 9,671,487 B2
(45) Date of Patent: Jun. 6, 2017

(54) TRACK TEST LOAD DEVICE AND TRACK TEST LOAD SYSTEM FOR CALIBRATING A CONSTANT WARNING TIME DEVICE

(71) Applicant: SIEMENS INDUSTRY, INC., Alpharetta, GA (US)

(72) Inventors: Brian Harp, New Albany, IN (US); Jay Yocum, Nabb, IN (US)

(73) Assignee: SIEMENS INDUSTRY, INC., Alpharetta, GA (US)

( * ) Notice: Subject to any disclaimer, the term of this patent is extended or adjusted under 35 U.S.C. 154(b) by 20 days.

(21) Appl. No.: 14/812,639

(22) Filed: Jul. 29, 2015

(65) Prior Publication Data
US 2017/0030993 A1 Feb. 2, 2017

(51) Int. Cl.
*G01R 35/00* (2006.01)
*B61L 29/22* (2006.01)
*B61L 29/30* (2006.01)

(52) U.S. Cl.
CPC ............ *G01R 35/005* (2013.01); *B61L 29/22* (2013.01); *B61L 29/30* (2013.01)

(58) Field of Classification Search
CPC ..... G01N 35/00722; G01N 2291/2623; G01N 29/12; B61K 13/00; B61K 9/00; B61L 15/0072; B61L 15/0081; B61L 2205/04; B61L 25/021; B61L 25/025; B61L 27/0077; B61L 1/02; B61L 1/185; B61L 1/187; B61L 1/20; B61L 29/30; B61B 13/00; B61C 3/00; B61C 3/02; G01R 31/026
See application file for complete search history.

(56) References Cited

U.S. PATENT DOCUMENTS

| 4,307,860 A | * | 12/1981 | Kuhn | B61L 29/286 246/125 |
| 5,924,652 A | * | 7/1999 | Ballinger | B61L 1/188 246/126 |
| 2012/0016542 A1 | * | 1/2012 | Severson | A63H 19/24 701/19 |

OTHER PUBLICATIONS

1491 Series—High Accuracy All-Purpose Inductor [retrieved from internet on Mar. 21, 2017]. <URL: http://web.archive.org/web/20121025012228/http://www.ietlabs.com/pdf/Datasheets/1491.pdf > published on Oct. 25, 2012 as per Wayback Machine.
Holmstrom, F., "Standby Power for Railroad-Highway Grade Crossing Warning Systems", University of Lowell Research Foundation, published Sep. 1976. <URL: www.fra.dot.gov/Elib/Document/16627>.
Waltrip, B. et al., "Inductance measurement using an LCR meter and a current transformer interface" Instrumentation and Measurement Technology Conference, 2005. IMTC 2005. Proceedings of the IEEE. vol. 2. IEEE, 2005.

* cited by examiner

*Primary Examiner* — Vinh Nguyen

(57) ABSTRACT

A track test load device includes an inductor assembly with simulated track inductors simulating a rail track, a connector assembly for connecting the inductor assembly to a constant warning time device, and a multi-way-switch-assembly with a multi-way-switch with multiple switch positions. The multi-way-switch assembly is operably coupled between the inductor assembly and the connector assembly, wherein a switch position of the multi-way-switch corresponds to an operating mode of the track test load device. Furthermore, a track test load system and a method for testing a constant warning time device are disclosed.

13 Claims, 4 Drawing Sheets

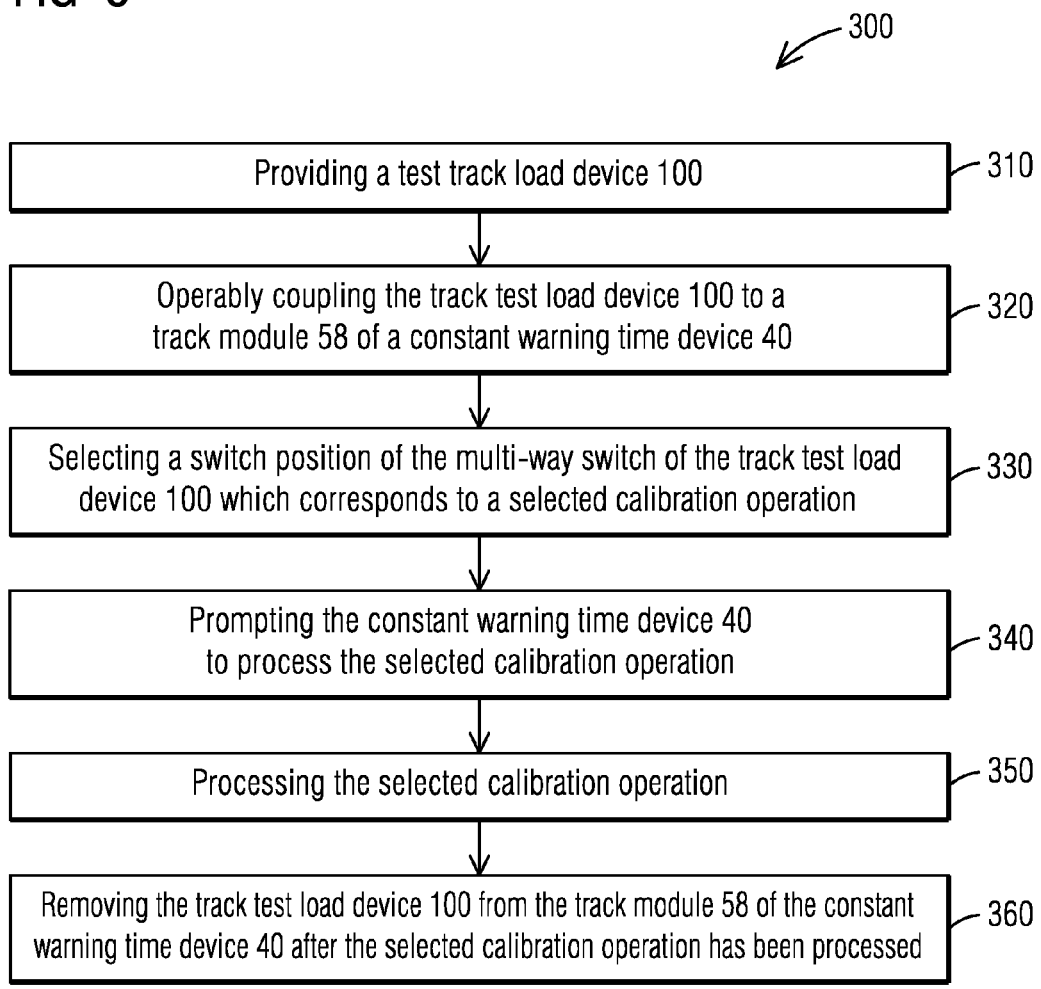

TRACK TEST LOAD DEVICE AND TRACK TEST LOAD SYSTEM FOR CALIBRATING A CONSTANT WARNING TIME DEVICE

BACKGROUND

1. Field

Aspects of the present invention generally relate to a track test load device, a track test load system, and a method for testing a constant warning time device.

2. Description of the Related Art

A constant warning time device, also referred to as a grade crossing predictor in the U.S. or a level crossing predictor in the U.K., is an electronic device that is connected to the rails of a railroad track and is configured to detect the presence of an approaching train and determine its speed and distance from a crossing, i.e., a location at which the tracks cross a road, sidewalk or other surface used by moving objects. The constant warning time device will use this information to generate a constant warning time signal for controlling a crossing warning device. A crossing warning device is a device that warns of the approach of a train at a crossing, examples of which include crossing gate arms (e.g., the familiar black and white striped wooden arms often found at highway grade crossings to warn motorists of an approaching train), crossing lights (such as the red flashing lights often found at highway grade crossings in conjunction with the crossing gate arms discussed above), and/or crossing bells or other audio alarm devices. Constant warning time devices are often (but not always) configured to activate the crossing warning device at a fixed time (e.g., 30 seconds) prior to an approaching train arriving at a crossing.

Typical constant warning time devices include a transmitter that transmits a signal over a circuit formed by the track's rails and one or more termination shunts positioned at desired approach distances from the transmitter, a receiver that detects one or more resulting signal characteristics, and a logic circuit such as a microprocessor or hardwired logic that detects the presence of a train and determines its speed and distance from the crossing. The approach distance depends on the maximum allowable speed of a train, the desired warning time, and a safety factor. Preferred embodiments of constant warning time devices generate and transmit a constant current AC signal on said track circuit; constant warning time devices detect a train and determine its distance and speed by measuring impedance changes caused by the train's wheels and axles acting as a shunt across the rails, which effectively shortens the length (and hence lowers the impedance) of the rails in the circuit. Multiple constant warning devices can monitor a given track circuit if each device measures track impedance at a different frequency.

Currently, when testing a failing grade crossing predictor (GCP), a dummy track test load may be used to determine if the problem is in the track or in the GCP. Such a dummy track test load may also be used to set up a GCP system in a lab or shop for testing or training purposes. The dummy track test load is attached to the GCP using ring terminals across an entrance terminal board of the GCP housing, which requires removal of field wiring to allow for the connection of the dummy track test load. Since more than one wire/connector is removed, the Federal Railroad Administration considers that the circuitry has been disarranged and there is a chance that the wires will not be reconnected in the same place as they were removed from which can cause a drastic change in the operation of the GCP system. Furthermore, existing dummy track test load devices provide only limited testing. Thus, there may be a need for a technique for testing a grade crossing predictor which provides easy handling and multiple test options.

SUMMARY

Briefly described, aspects of the present invention relate to a track test load device, a track test load system, and a method for testing a constant warning time device, also referred to as grade crossing predictor (GCP) or grade crossing predictor system (GCP system).

A first aspect of the present invention provides a track test load device comprising an inductor assembly comprising simulated track inductors simulating a rail track; a connector assembly for connecting the inductor assembly to a constant warning time device; and a multi-way-switch-assembly comprising a multi-way-switch with multiple switch positions, wherein the multi-way-switch assembly is operably coupled between the inductor assembly and the connector assembly, and wherein a switch position of the multi-way-switch corresponds to an operating mode of the track test load device.

A second aspect of the present invention provides a track test load system comprising a test track load device comprising an inductor assembly comprising simulated track inductors simulating a rail track; a connector assembly for connecting the inductor assembly to a constant warning time device; a multi-way-switch-assembly comprising a multi-way-switch with multiple switch positions, wherein the multi-way-switch assembly is operably coupled between the inductor assembly and the connector assembly; and a constant warning time device comprising at least one track module, wherein the track test load device is operably coupled to the at least one track module via the connector assembly for performing calibration operations of the constant warning time device such that a switch position of the multi-way-switch corresponds to a calibration operation.

A third aspect of the present invention provides a method for testing a constant warning time device comprising providing a test track load device comprising an inductor assembly comprising simulated track inductors simulating a rail track; a connector assembly for connecting the inductor assembly to a constant warning time device; and a multi-way-switch-assembly comprising a multi-way-switch with multiple switch positions, wherein the multi-way-switch assembly is operably coupled between the inductor assembly and the connector assembly; operably coupling the test track load device to a track module of a constant warning time device via the connector assembly; selecting a switch position of the multi-way-switch, wherein the switch position corresponds to a selected calibration operation of the constant warning time device; and prompting the constant warning time device to process the selected calibration operation.

BRIEF DESCRIPTION OF THE DRAWINGS

FIG. 5 illustrates a flow chart of a method for testing a constant warning time device (GCP) in accordance with an exemplary embodiment of the present invention.

DETAILED DESCRIPTION

To facilitate an understanding of embodiments, principles, and features of the present invention, they are explained hereinafter with reference to implementation in illustrative embodiments. In particular, they are described in the context of being track test load devices, track test load systems, and a method for testing a constant warning time device. Embodiments of the present invention, however, are not limited to use in the described devices or methods.

The components and materials described hereinafter as making up the various embodiments are intended to be illustrative and not restrictive. Many suitable components and materials that would perform the same or a similar function as the materials described herein are intended to be embraced within the scope of embodiments of the present invention.

Figure 1:
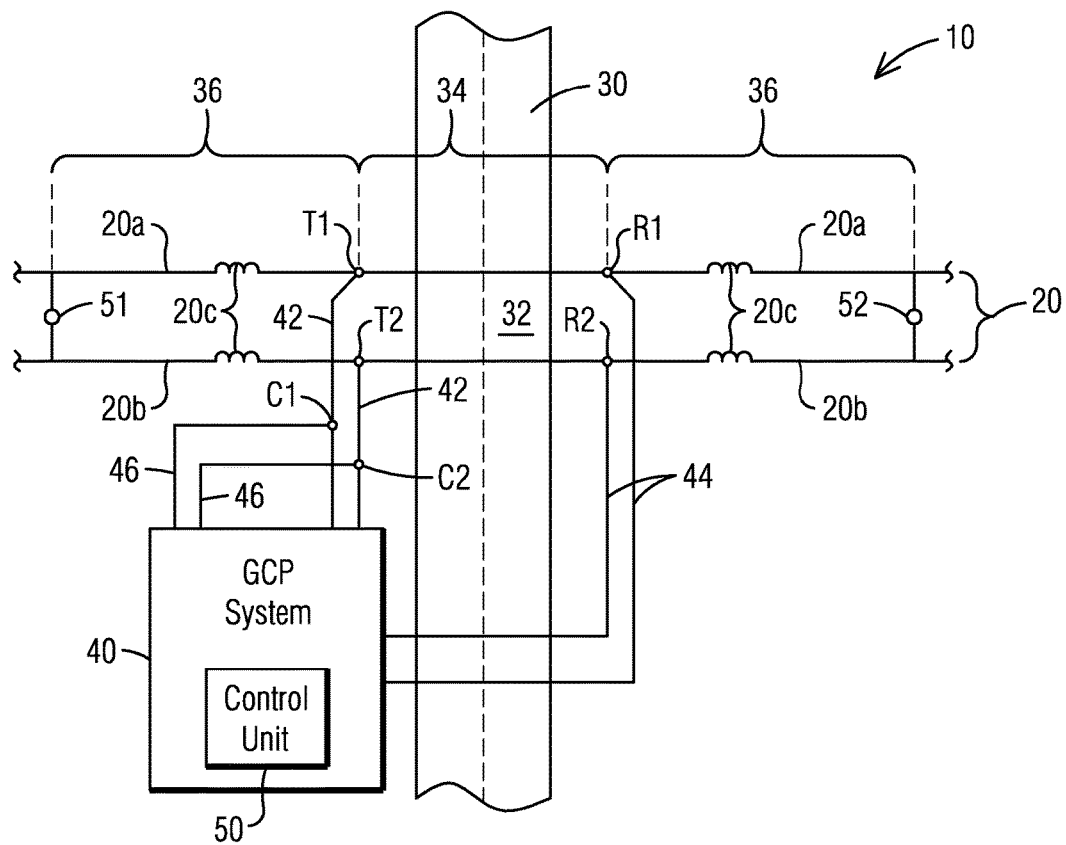
FIG. 1 illustrates an example track system constructed in accordance with an embodiment disclosed herein.

FIG. 1 illustrates a known railroad track system 10 in accordance with a disclosed embodiment. The railroad track system 10 is provided at a location in which a road 30 crosses a railroad track 20. The crossing of the road 30 and the railroad track 20 forms an island 32.

The railroad track 20 includes two rails 20a, 20b and a plurality of ties (not shown in FIG. 1) that are provided over and within railroad ballast (not shown in FIG. 1) to support the rails 20a, 20b. The rails 20a, 20b are shown as including inductors 20c. The inductors 20c, however, are not separate physical devices but rather are shown to illustrate the inherent distributed inductance of the rails 20a, 20b.

The system 10 includes a constant warning time device 40, also referred to as grade crossing predictor (GCP or GCP system), that comprises a transmitter that connects to the rails 20a, 20b at transmitter connection points T1, T2 on one side of the road 30 via transmitter wires 42. The constant warning time device 40 also comprises a main receiver that connects to the rails 20a, 20b at main receiver connection points R1, R2 on the other side of the road 30 via receiver wires 44. The receiver wires 44 are also referred to as main channel receiver wires. The constant warning time device 40 further comprises a check receiver that connects to the rails 20a, 20b at check receiver connection points C1, C2 via check channel receiver wires 46. The check channel receiver wires 46 are connected to the track 20 on the same side of the road 30 as the transmitter wires 42, resulting in a six-wire system. The main channel receiver and check channel receiver operate in much the same manner with an incoming train move, providing a parallel check of the main channel operation. Those of skill in the art will recognize that the transmitter and receivers (main channel receiver and check channel receiver), other than the physical conductors that connect to the track 20, are often co-located in an enclosure located on one side of the road 30. The constant warning time device 40 includes a control unit 50 connected to the transmitter and receivers. The control unit includes logic, which may be implemented in hardware, software, or a combination thereof, for calculating train speed, distance and direction, and producing constant warning time signals for the crossing.

Also shown in FIG. 1 is a pair of termination shunts S1, S2, one on each side of the road 30 at a desired distance from the center of the island 32, e.g., 3000 feet. It should be appreciated that FIG. 1 is not drawn to scale and that both shunts S1, S2 are approximately the same distance away from the center of the island 32. The termination shunts S1, S2 can be embodied for example as narrow band shunts (NBS). FIG. 1 further illustrates an island circuit 34 which is the area between transmitter connection points T1, T2 and main receiver connection points R1, R2. For example, the constant warning time device 40 monitors the island circuit 34 as well as approach circuits 36 which lie to the right and left of the island circuit 34, i.e., between the island circuit 34 and the termination shunts S1, S2.

Typically, the shunts S1, S2 positioned on both sides of the road 30 and the associated constant warning time device 40 are tuned to the same frequency. This way, the transmitter can continuously transmit one AC signal having one frequency, the receiver can measure the voltage response of the rails 20a, 20b and the control unit 50 can make impedance and constant warning time determinations based on the one specific frequency. When a train crosses one of the termination shunts S1, S2, the train's wheels and axles act as shunts, which lowers the inductance, impedance and voltage measured by the corresponding control unit 50. Measuring the change in the impedance indicates the distance of the train, and measuring the rate of change of the impedance (or integrating the impedance over time) allows the speed of the train to be determined.

Figure 2:
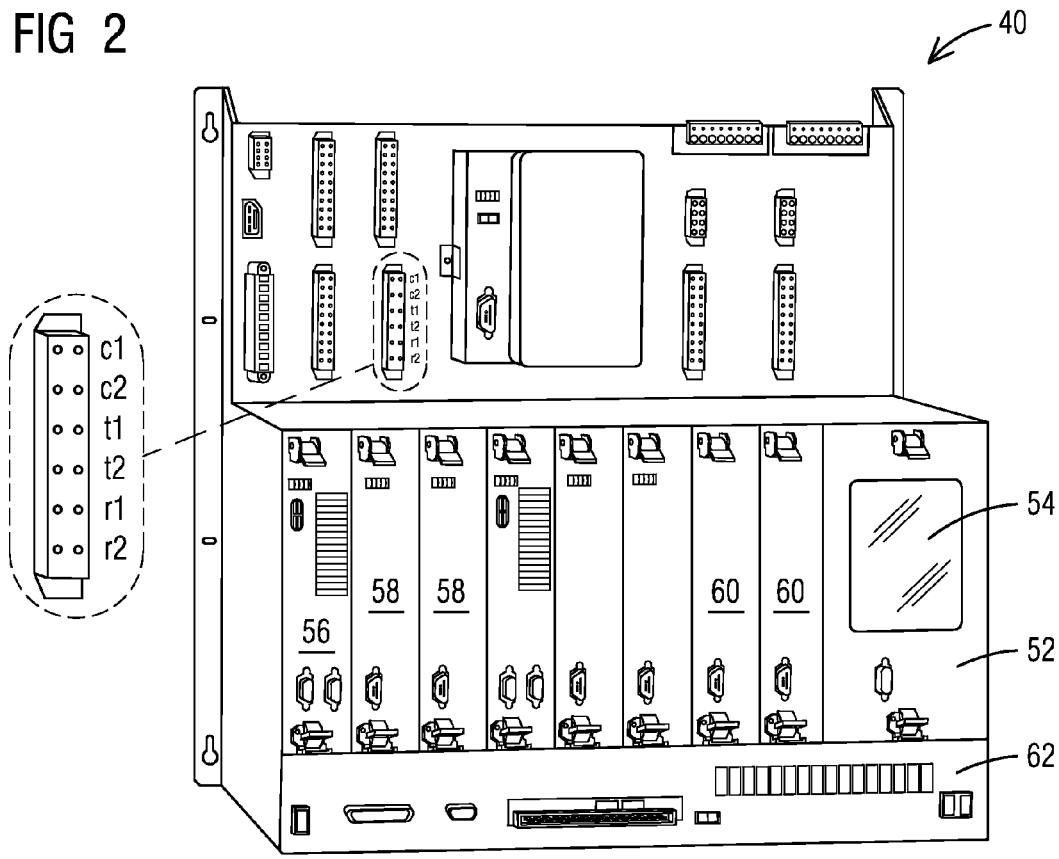
FIG. 2 illustrates an example constant warning time device (GCP) in accordance with an embodiment disclosed herein.

FIG. 2 illustrates an example constant warning time device (GCP) 40 in accordance with an embodiment disclosed herein. The GCP 40 (also referred to as GCP system or controller) is typically enclosed within a generally weatherproof bungalow or housing and usually in general proximity to at least one of the railroad tracks 20.

With reference to FIG. 2, the GCP system 40 is an integrated system that includes all of the control, train detection, recording and monitoring functions for the railroad track system 10 shown in FIG. 1. GCP system 40 includes a plurality of modules. One of these modules is a display module 52 with a display 54. Display 54 can be a touch screen display that provides a user interface, for example for initial setup, calibration and troubleshooting of the GCP system 40. Other modules may include a central processing unit (CPU) 56, track modules 58 for monitoring each track, crossing control modules 60 for controlling traffic warning gates, and a recorder module 62 for recording events and conditions at the railroad track system 10. Each of the modules may have external connectors, test points and lighted indicators. For example, each track module 58 comprises transmitter connection pins t1, t2, main receiver connection pins r1, r2, and check receiver connection pins c1, c2.

Currently, when testing the GCP system 40, for example before it is actually operably coupled to the railroad track 20, a dummy track test load may be used for initial setup and calibration of the GCP system 40, for example in a lab or shop. Also, when testing a failing GCP system, such a dummy track test load may be used to determine if the problem is in the track or in the GCP. However, existing dummy track test load devices provide only limited testing.

Figure 3:
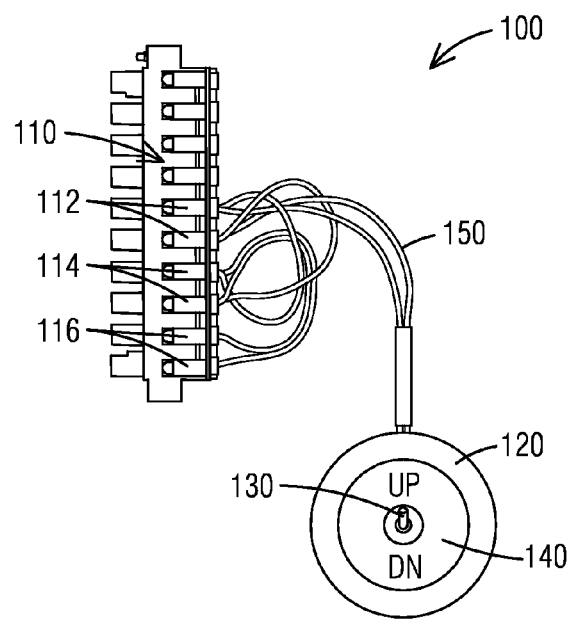
FIG. 3 illustrates a track test load device for a constant warning time device (GCP) in accordance with an exemplary embodiment of the present invention.

FIG. 3 illustrates a track test load device 100 for a constant warning time device (GCP) 40 in accordance with an exemplary embodiment of the present invention.

Before the GCP system 40 is put into operation, the GCP system 40 needs to be set up, also referred to as calibration, for example according to specific requirements of the railroad track 20 including a road crossing where it will be located. Such a set up or initial calibration typically includes:

Adjustment of the track modules 58 to the track circuit system 10, i.e., calibration of the track circuit system 10 into the shunts S1, S2, also referred to as Calibration "GCP CAL", Calibration of each approach circuit 36 into the hard-wired shunts S1, S2 placed at the end of each approach circuit 36, also referred to as Setup for Approach "GCP APP", Calibration of track circuit linearization into hard-wired shunts placed at 50% of the approach distance of each approach circuit 36, also referred to as Linearization "GCP LIN", and Calibration of the island track circuit 34 into hard-wired shunts placed at prescribed distances outside of the island circuit 34, also referred to as Island Calibration "ISL CAL".

It should be noted that the mentioned calibration operations GCP CAL, GCP APP, GCP LIN and ISL CAL will not be described in further detail as those of ordinary skill in the art are familiar with these calibration operations.

Using the track test load device 100 as illustrated in FIG. 3, a user is not only able to perform a calibration of the GCP system 40 (GCP CAL), which is what existing dummy track test load devices are typically limited to, but all of the above mentioned calibration operations GCP CAL, GCP APP, GCP LIN and ISL CAL.

The track test load device 100 comprises a connector assembly 110 to interface with the GCP system 40, in particular with one of the track modules 58 of (see FIG. 2). The connector assembly 110 comprises for example a cage clamp connector. Thus, only a single keyed connector is required to be removed from the track module 58 instead of multiple wires which lessens the chance of incorrectly restoring the circuits when the testing is completed.

The track test load device 100 further comprises an inductor assembly with simulated track inductors 120, in particular a pair of simulated track inductors 120, each representing a dummy load simulating for example a rail track with a length of 1000 ft, wherein the track inductors 120 are electrically coupled in series. The track inductors 120 as shown in FIG. 3 are mounted on top of each other. It should be understood that many other simulated track inductors can be used, depending on what rail tracks should be simulated, for example 2000 ft or 3000 ft. A multi-way-switch-assembly comprising a multi-way-switch 130 with multiple switch positions is operably coupled between the inductor assembly with inductors 120 and the connector assembly 110, wherein a switch position of the multi-way-switch 130 corresponds to an operating mode of the track test load device 100. The multi-way-switch 130 is arranged in parallel to the inductor assembly and the connector assembly 110. The switch 130 is operably coupled to the simulated track inductors 120 in such a way that, when the device 100 is operably coupled to the GCP system 40, the simulated track inductors 120 are electrically connected in different ways to represent different operation modes. For example, the multi-way switch 130 can comprise three switch positions, wherein a first switch position corresponds to a first operating mode, a second switch position corresponds to a second operating mode, and a third switch position corresponds to a third operating mode of the track test load device 100, and consequently the constant warning time device 40. For example, the connections can be selected such that all the different calibration operations GCP CAL, GCP APP, GCP LIN and ISL CAL can be performed using the device 100. A fender washer 140 can be used for safely mounting the switch 130 to the simulated track inductors 120.

With further reference to FIG. 3, the connector assembly 110 connects the simulated track inductors 120 of the inductor assembly to a track module 58 of the constant warning time device 40 (see FIG. 2). The simulated track inductors 120 are electrically coupled to the connector assembly 110 via connecting elements, for example wires 150. The wires 150 represent transmitter wires, receiver wires and check receiver wires (see FIG. 1). The connector 110 comprises a pair of slots 112 for receiving the check receiver wires, a pair of slots 114 for receiving the transmitter wires, and a pair of slots 116 for receiving the receiver wires. The two simulated track inductors 120 are directly electrically coupled to the slots 112 designated for receiving the check receiver wires. The simulated track inductors 120 are further indirectly coupled to the slots 114 and 116 by providing electrical connections between the slots 112 and 114 and between the slots 114 and 116 using the wires 150. When connecting the connector 110 to one of the track modules 58 of the GCP system 40 (see FIG. 2), the slots 112 will connect to check receiver connection pins c1, c2, the slots 114 will connect to transmitter connections pins t1, t2, and the slots 116 will connect to receiver connection pins r1, r2 (see FIGS. 4a-4c).

The addition of a second dummy track load, represented by a second simulated track inductor 120, and the three-way-switch provide a unique track test load device 100 because the device 100 allows the full setup and calibration range of the GCP 40 to be exercised.

Figure 4A:
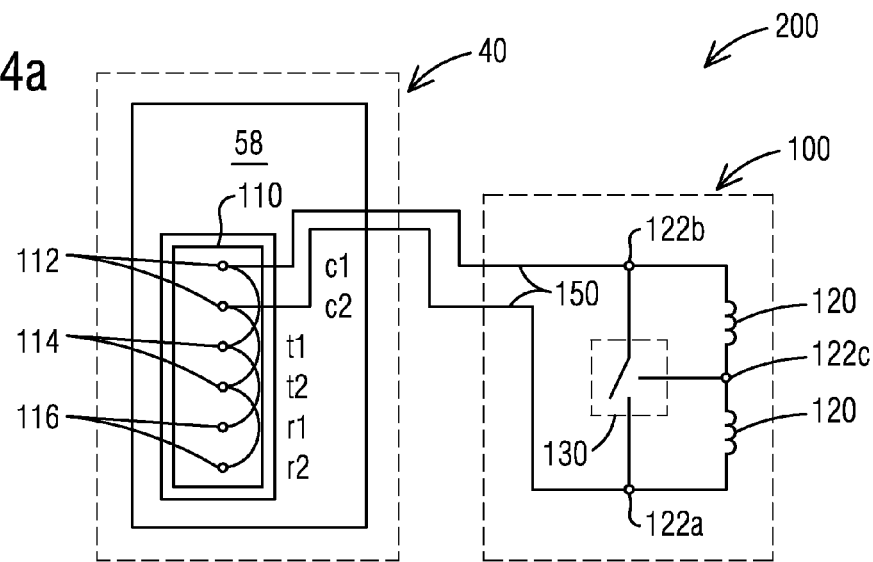
FIGS. 4a, 4b, and 4c illustrate a schematic diagram of a track test load system comprising a track test load device electrically coupled to a constant warning time device (GCP) in accordance with an exemplary embodiment of the present invention
Figure 4B:
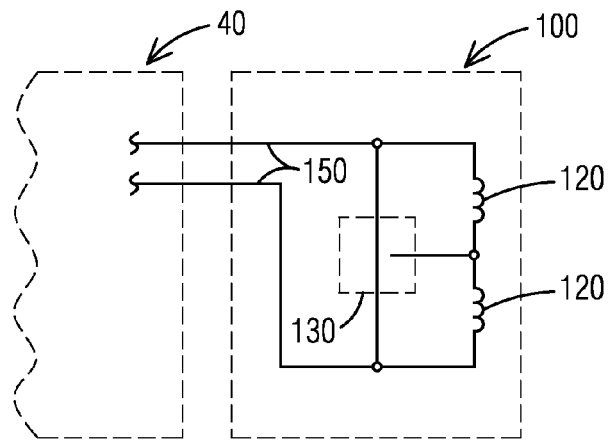
Figure 4C:
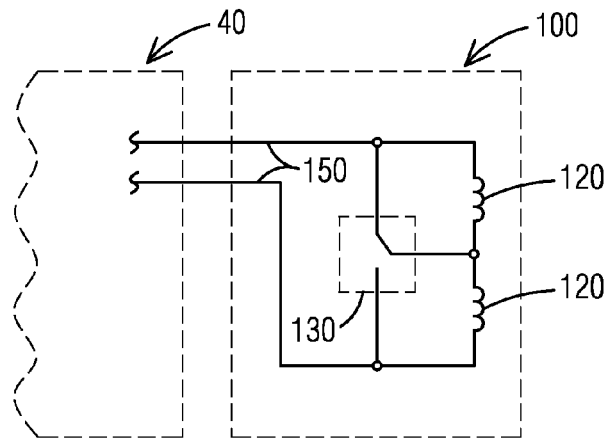

FIGS. 4a, 4b and 4c illustrate schematic diagrams of a track test load system 200 comprising the track test load device 100, as described for example in FIG. 3, electrically coupled to a constant warning time device (GCP) 40 in accordance with an exemplary embodiment of the present invention.

FIGS. 4a, 4b and 4c illustrate the electrical connections to the GCP system 40 when the track test load device 100 is electrically connected to the GCP system 40. As described before, the track test load device 100 comprises the simulated track inductors 120, the multi-way-switch 130, and the electrical connecting elements 150.

Furthermore, a section of a GCP system 40, in particular of a track module 58 is schematically shown, comprising transmitter connection pins t1, t2, main receiver connection pins r1, r2, and check receiver connection pins c1, c2 (see also FIG. 2) for electrically coupling the track test load device 100 to the track module 58 using the wires 150. The connector assembly 110 of the test track load device 100 is inserted into the appropriate place of the track module 58 of the GCP system 40 which means that the slots 112 of the connector assembly 110 (see FIG. 3) connect to the check receiver connection pins c1, c2, the slots 114 connect to the transmitter connections pins t1, t2, and the slots 116 connect to receiver connection pins r1, r2 (see FIG. 3). The three-way-switch 130 is connected in parallel to the simulated track inductors 120 with connection points 122a, 122b between the simulated track inductors 120 and the check receiver connections pins c1, c2 and with connection point 122c between the track inductors 120 themselves.

FIG. 4a illustrates a first setting of the switch 130 which is used for GCP CAL and GCP APP (calibration and setup approach). The switch 130 is in an up-position, where the switch 130 is open and does not connect any of the connection points 122a, 122b and 122c. When the GCP system 40, in particular the transmitter of the GCP system 40 transmits an AC signal via the track inductors 120, the receiver of the GCP system 40 can measure the voltage response of the track inductors 120 in order to calibrate the GCP system 40 and the approach circuits 36 (see FIG. 1).

FIG. 4b illustrates a second setting of the switch 130 which is used for ISL CAL (setup island circuit). The switch 130 is in a middle-position so that a connection is provided between connection points 122a and 122b. As FIG. 4b shows, the AC signal is transmitted in parallel between the transmitter and main and check receivers of the GCP system 40 as well as via the track inductors 120 for calibrating the island circuit 34 (see FIG. 1).

FIG. 4c illustrates a third setting of the switch 130 which is used for GCP LIN (setup linearization). The switch 130 is in a down-position so that a connection is provided between connection points 122b and 122c. As connection point 122c is arranged between the track inductors 120, a shunt is simulated at approximately 50% of the dummy loads, represented by the inductors 120, simulating the approach circuit 36 (see FIG. 1).

FIG. 5 illustrates a flow chart of a method 300 for testing a constant warning time device (GCP) 40, as described for example in FIG. 2, in accordance with an exemplary embodiment of the present invention. In step 310, a test track load device 100, as described for example in FIG. 3, is provided. In step 320, the track test load device 100 is operably coupled to a track module 58 of a constant warning time device 40 (see FIG. 2). Step 330 comprises selecting a switch position of the multi-way-switch of the track test load device 100, wherein the switch position corresponds to a selected calibration operation of the constant warning time device 40. Step 340 includes prompting the constant warning time device 40 to process the selected calibration operation. The selected calibration operation is processed (step 350), and in step 360, the track test load device 100 is removed from the track module 58 of the constant warning time device 40 after the selected calibration operation has been performed and/or processed. It should be appreciated that some steps are not required to be performed in any particular order, or are optional, or can be repeated multiple times. For example, multiple calibration operations can be selected and/or performed before the track test load device 100 is removed from the constant warning time device 40.

While embodiments of the present invention have been disclosed in exemplary forms, it will be apparent to those skilled in the art that many modifications, additions, and deletions can be made therein without departing from the spirit and scope of the invention and its equivalents, as set forth in the following claims.

What is claimed is:

1. A track test load device comprising:
an inductor assembly comprising simulated track inductors simulating a rail track;
a connector assembly for connecting the inductor assembly to a constant warning time device; and
a multi-way-switch-assembly comprising a multi-way-switch with multiple switch positions,
wherein the multi-way-switch assembly is operably coupled between the inductor assembly and the connector assembly, and wherein a switch position of the multi-way-switch corresponds to a calibration operation for calibrating a constant warning time device when the track test load device is coupled to the constant warning time device, the connector assembly being configured to be inserted into a track module of the constant warning time device, wherein an alternating current (AC) signal is transmitted by the constant warning time device via the simulated track inductors and a voltage response of the simulated track inductors is measured by the constant warning time device for calibrating the constant warning time device.

2. The track test load device of claim 1, wherein the multi-way-switch is a three-way-switch arranged in parallel to the inductor assembly and the connector assembly.

3. The track test load device of claim 1, wherein the multi-way switch comprises three switch positions, wherein a first switch position corresponds to a first calibration operation, a second switch position corresponds to a second calibration operation, and a third switch position corresponds to a third calibration operation of the track test load device.

4. The track test load device of claim 3, wherein the first calibration operation is for calibration (GCP CAL) and for setup for approach (GCP APP) of the constant warning time device.

5. The track test load device of claim 3, wherein the second calibration operation is for calibration of an island circuit (ISL CAL) of the constant warning time device.

6. The track test load device of claim 3, wherein the third calibration operation is for setup for linearization (GCP LIN) of the constant warning time device.

7. The track test load device of claim 1, wherein the simulated track inductors are electrically connected in series and are operably coupled to the connector assembly via electrical connecting elements.

8. The track test load device of claim 7, wherein the connector assembly includes a cage clamp connector comprising a plurality of slots for receiving the electrical connecting elements.

9. A track test load system comprising:
a test track load device comprising:
an inductor assembly comprising simulated track inductors simulating a rail track;
a connector assembly for connecting the inductor assembly to a constant warning time device;
a multi-way-switch-assembly comprising a multi-way-switch with multiple switch positions, wherein the multi-way-switch assembly is operably coupled between the inductor assembly and the connector assembly; and
a constant warning time device comprising:
at least one track module,
wherein the track test load device is operably coupled to the at least one track module via the connector assembly for performing calibration operations of the constant warning time device, a switch position of the multi-way-switch corresponding to a calibration operation of the constant warning time device, wherein an alternating current (AC) signal is transmitted by the constant warning time device via the simulated track inductors, and a voltage response of the simulated track inductors is measured by the constant warning time device for calibrating the constant warning time device.

10. The track test load system of claim 9, wherein the multi-way switch comprises three switch positions, wherein a first switch position corresponds to a first calibration operation, a second switch position corresponds to a second calibration operation, and a third switch position corresponds to a third calibration operation of the constant warning time device.

11. The track test load device of claim 10, wherein the first calibration operation is calibration (GCP CAL) and setup for approach (GCP APP) of the constant warning time device.

12. The track test load device of claim 10, wherein the second calibration operation is calibration of an island circuit (ISL CAL) of the constant warning time device.

13. The track test load device of claim 10, wherein the third calibration operation is setup for linearization (GCP LIN) of the constant warning time device.

* * * * *